(12) United States Patent
Ottens et al.

(10) Patent No.: US 8,003,968 B2
(45) Date of Patent: *Aug. 23, 2011

(54) LITHOGRAPHIC APPARATUS AND SUBSTRATE EDGE SEAL

(75) Inventors: Joost Jeroen Ottens, Veldhoven (NL); Johannes Henricus Wilhelmus Jacobs, Eindhoven (NL); Nicolaas Rudolf Kemper, Eindhoven (NL); Martinus Hendrikus Antonius Leenders, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 472 days.

This patent is subject to a terminal disclaimer.

(21) Appl. No.: 12/219,606

(22) Filed: Jul. 24, 2008

(65) Prior Publication Data

US 2008/0284995 A1    Nov. 20, 2008

Related U.S. Application Data

(63) Continuation of application No. 11/317,259, filed on Dec. 27, 2005, now Pat. No. 7,420,194.

(51) Int. Cl.
 G03F 7/20 (2006.01)
 G03B 27/52 (2006.01)
(52) U.S. Cl. .......................... 250/548; 355/30
(58) Field of Classification Search .................. 250/548, 250/559.4; 355/30, 53
 See application file for complete search history.

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,121,256 A | 6/1992 | Corle et al. | |
| 5,610,683 A | 3/1997 | Takahashi | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | |
| 6,600,547 B2 | 7/2003 | Watson et al. | |
| 6,603,130 B1 | 8/2003 | Bisschops et al. | |
| 7,199,858 B2 | 4/2007 | Lof et al. | |
| 7,304,715 B2 * | 12/2007 | Cadee et al. | 355/30 |
| 7,420,194 B2 * | 9/2008 | Ottens et al. | 250/548 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — John R Lee
(74) *Attorney, Agent, or Firm* — Pillsbury Winthrop Shaw Pittman LLP

(57) ABSTRACT

A method of helping to prevent liquid reaching under a substrate is disclosed that includes introducing a gas at a bottom edge of the substrate so that a buffer is created at the edge of the substrate, helping to keep immersion liquid that is present at the top and edge of the substrate away from the bottom surface of the substrate.

36 Claims, 4 Drawing Sheets

U.S. PATENT DOCUMENTS

| | | | |
|---|---|---|---|
| 7,804,575 B2 * | 9/2010 | Cadee et al. | 355/30 |
| 2002/0020821 A1 | 2/2002 | Van Santen et al. | |
| 2002/0163629 A1 | 11/2002 | Switkes et al. | |
| 2003/0123040 A1 | 7/2003 | Almogy | |
| 2004/0000627 A1 | 1/2004 | Schuster | |
| 2004/0075895 A1 | 4/2004 | Lin | |
| 2004/0114117 A1 | 6/2004 | Bleeker | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2004/0239954 A1 | 12/2004 | Bischoff | |
| 2004/0263809 A1 | 12/2004 | Nakano | |
| 2005/0007569 A1 | 1/2005 | Streefkerk et al. | |
| 2005/0018155 A1 | 1/2005 | Cox et al. | |
| 2005/0024609 A1 | 2/2005 | De Smit et al. | |
| 2005/0030497 A1 | 2/2005 | Nakamura | |
| 2005/0046813 A1 | 3/2005 | Streefkerk et al. | |
| 2005/0046934 A1 | 3/2005 | Ho et al. | |
| 2005/0052632 A1 | 3/2005 | Miyajima | |
| 2005/0094116 A1 | 5/2005 | Flagello et al. | |
| 2005/0094125 A1 | 5/2005 | Arai | |
| 2005/0122505 A1 | 6/2005 | Miyajima | |
| 2005/0132914 A1 | 6/2005 | Mulkens et al. | |
| 2005/0134817 A1 | 6/2005 | Nakamura | |
| 2005/0140948 A1 | 6/2005 | Tokita | |
| 2005/0146693 A1 | 7/2005 | Ohsaki | |
| 2005/0146694 A1 | 7/2005 | Tokita | |
| 2005/0151942 A1 | 7/2005 | Kawashima | |
| 2005/0200815 A1 | 9/2005 | Akamatsu | |
| 2005/0213065 A1 | 9/2005 | Kitaoka | |
| 2005/0213066 A1 | 9/2005 | Sumiyoshi | |
| 2005/0219489 A1 | 10/2005 | Nei et al. | |
| 2005/0233081 A1 | 10/2005 | Tokita | |
| 2006/0033892 A1 * | 2/2006 | Cadee et al. | 355/30 |
| 2006/0103820 A1 | 5/2006 | Donders et al. | |
| 2006/0114445 A1 | 6/2006 | Ebihara | |
| 2006/0285091 A1 * | 12/2006 | Parekh et al. | 355/30 |
| 2007/0030463 A1 * | 2/2007 | Parekh et al. | 355/30 |
| 2007/0211234 A1 | 9/2007 | Ebihara | |
| 2008/0284995 A1 * | 11/2008 | Ottens et al. | 355/30 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 | 5/2004 |
| EP | 1 420 300 | 8/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2005-310933 A | 11/2005 |
| JP | 2006-173527 A | 6/2006 |
| WO | 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/112108 | 12/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—2003 Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interfermoetric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Notification of Reason(s) for Refusal for Japanese Patent Application No. 2006-349601 dated Mar. 2, 2010.

* cited by examiner

LITHOGRAPHIC APPARATUS AND SUBSTRATE EDGE SEAL

The present application is a continuation of U.S. patent application Ser. No. 11/317,259 filed on Dec. 27, 2005 now U.S. Pat. No. 7,420,194, now allowed, for which priority is claimed under 35 U.S.C. §120. The entire contents of this application is herein fully incorporated by reference.

1. FIELD

The present invention relates to a lithographic apparatus. In particular, the present invention relates to an immersion system within a lithographic apparatus, wherein a space between an illumination system and a substrate to be illuminated is filled with a liquid.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

As depicted in FIG. 5, another solution which has been proposed is to provide the liquid supply system with a barrier member 12 which extends along at least a part of a boundary of the space between the final element of the projection system and the substrate table. Liquid 11 is supplied to and/or removed from the space by inlet/outlet 13. The barrier member is substantially stationary relative to the projection system PL in the XY plane though there may be some relative movement in the Z direction (in the direction of the optical axis). A seal 16 is formed between the barrier member and the surface of the substrate. In an embodiment, the seal is a contactless seal such as a gas seal 14, 15. Such a system with a gas seal is disclosed in U.S. patent application publication no. US 2004-0207824, hereby incorporated in its entirety by reference.

In European patent application publication no. EP 1420300 and United States patent application publication no. US 2004-0136494, each hereby incorporated in their entirety by reference the idea of a twin or dual stage immersion lithography apparatus is disclosed. Such an apparatus is provided with two tables for supporting the substrate. Leveling measurements are carried out with a table at a first position, without immersion liquid, and exposure is carried out with a table at a second position, where immersion liquid is present. Alternatively, the apparatus may have only one table movable between exposure and measurement positions.

For one or more reasons, it is desirable to prevent the bottom surface of a substrate from coming into contact with an immersion liquid. A first reason is that cooling of the substrate edge by cooler liquid or gas may cause temperature variations over the surface of the substrate, possibly causing overlay errors in the pattern printed on the target. A second reason is that capillary action of the liquid under the substrate may cause the substrate to stick to the substrate holder. Similarly, if liquid gets under a closing plate used to seal a space adjacent a projection system to keep liquid in contact with the projection system, the closing plate may stick to a substrate table used to hold the closing plate. A third reason is that liquid droplets on the backside of the substrate that are still present during a post-exposure bake may affect temperature homogeneity and thus may be detrimental to CD control. A fourth reason is that drying stains caused by liquid droplets drying on the back of the substrate may create backside particles that may contaminate the substrate table, possibly causing a tilt of the substrate resulting in overlay errors and focus hotspots. Such contamination may instead or also affect substrate clamping pressure build-up. Furthermore, there is the risk of cross-contamination of the substrate table, a substrate handling system and a substrate temperature conditioning unit.

3. SUMMARY

A way to deal with helping to prevent liquid from reaching underneath a substrate (or other object) is to have one or more liquid outlets (i.e., low pressure) under a cover ring that surrounds the substrate in substantially the same plane of the substrate, and another outlet under the substrate in the substrate holder, just inside the edge of the substrate, in order to suck immersion liquid down through these outlets before it penetrates too far underneath the substrate. Furthermore, gas may be supplied under the substrate, which flows towards the outside edge of the substrate, and joins the immersion liquid in being sucked out of the outlets (such as outlet 20 as shown in FIG. 6). This is known as a two-phase flow because liquid and gas are both in contact with the surface of the substrate. As shown in FIG. 6, immersion liquid 11 follows the direction of the arrows through a gap between the cover ring CR and the substrate W at pressures of −20000 Pa (i.e. a low pressure sucking at 20000 Pa) in the outlet 24 under the cover ring CR and pressures of, for example, −40000 Pa in the outlet 20 under the substrate W. The pressure of the gas under the substrate is at approximately 40000 Pa and this gas is sucked down the outlet 20 along with the immersion liquid 11.

A problem with this arrangement is that immersion liquid 11 penetrates to a relatively large distance underneath the substrate W, possibly causing localized cooling of the substrate edge and therefore "curling up" of the substrate edge. Furthermore, two-phase flows may cause a temperature fluctuation because uncontrolled evaporation and condensation may be allowed to occur. This is largely because liquid and gas have large differences in viscosity and so once an extraction path is cleared for the gas through the liquid, the liquid is less likely to by cleared along with the gas. This could leave liquid droplets behind on the backside of the substrate, causing one or more of the problems discussed above.

Accordingly, it would be desirable, for example, to provide a system that maintains a low pressure under the substrate, keeping the bottom surface of the substrate dry.

According to an aspect of the invention, there is provided a lithographic apparatus, comprising:

a projection system configured to project a patterned radiation beam onto a target portion of a substrate;

a substrate holder configured to hold the substrate;

an outlet configured to provide a low pressure between the substrate and the substrate holder;

a liquid supply system configured to supply liquid to a space between the projection system and the substrate holder; and a gas inlet located near a bottom edge of the substrate when held by the substrate holder, the gas inlet configured to supply gas to a space between the substrate and the substrate holder so as to substantially seal supplied liquid from the low pressure.

Supplying gas to a space between the substrate and the substrate holder at the substrate edge, rather than sucking out liquid that enters the space, means that a gas buffer may be created near the edge of the substrate. This may keep a clear separation between the immersion liquid and a low pressure of a space below the substrate. In addition or alternatively, this may provide a single phase flow under the substrate, possibly reducing energy gradients across this surface. Two-phase flow that does occur may occurs under, for example, a cover ring rather than under the substrate W, thus possibly preventing one or more of the adverse effects described herein.

According to another aspect of the invention, there is provided an apparatus comprising:

a substrate holder configured to hold a substrate, an outlet configured to provide a low pressure between the substrate and the substrate holder, a liquid supply system configured to supply liquid to at least the top surface of the substrate, and a gas input at the bottom edge of the substrate configured to supply gas to the space between the substrate and the substrate holder so as to form a buffer at the bottom edge of the substrate to keep the liquid out of the low pressure.

According to another aspect of the invention, there is provided a lithographic apparatus, comprising:

a substrate table configured to hold a closing plate;

an outlet configured to provide a low pressure between the closing plate and the substrate table;

a liquid supply system configured to supply liquid to a top surface of the closing plate; and a gas inlet located near a bottom edge of the closing plate when held by the substrate table, the gas inlet configured to supply gas to a space between the closing plate and the substrate table so as to substantially seal supplied liquid from the low pressure.

According to another aspect of the invention, there is provided a method of sealing a low pressure under a substrate from liquid supplied to at least a top surface of the substrate comprising inputting gas at a lower edge of the substrate to provide a buffer at the edge of the low pressure through which the liquid may not substantially penetrate.

According to another aspect of the invention, there is provided a device manufacturing method, comprising:

projecting, via a liquid, a patterned beam of radiation onto a target portion of a substrate supported by a substrate holder;

providing a low pressure between the substrate and the substrate holder; and inputting gas at a lower edge of the substrate to provide a buffer at the edge of the low pressure through which the liquid may not substantially penetrate.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

5. DETAILED DESCRIPTION

Figure 1:
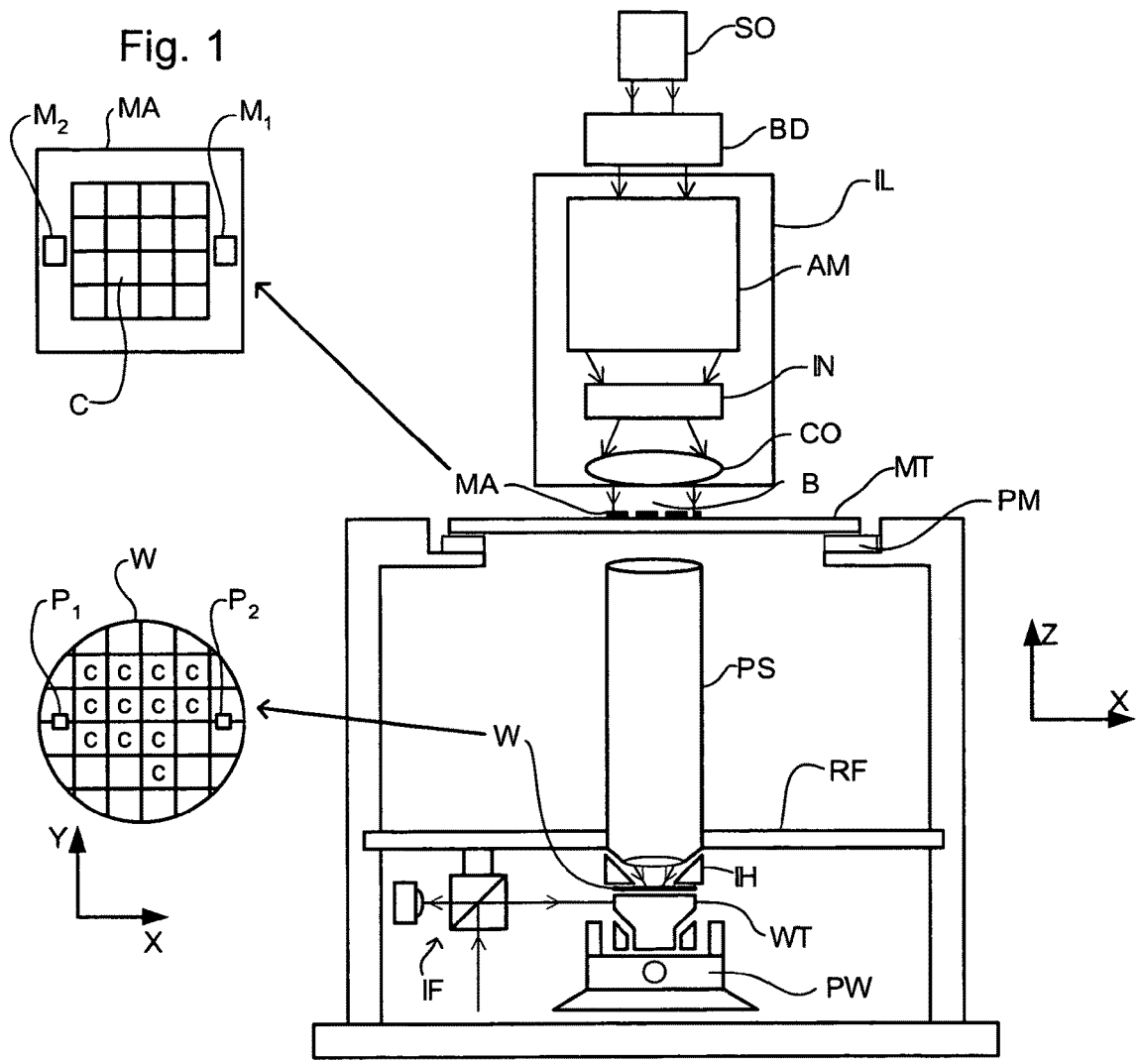
FIG. 1 depicts a lithographic apparatus according to an embodiment of the invention.
Figure 2:
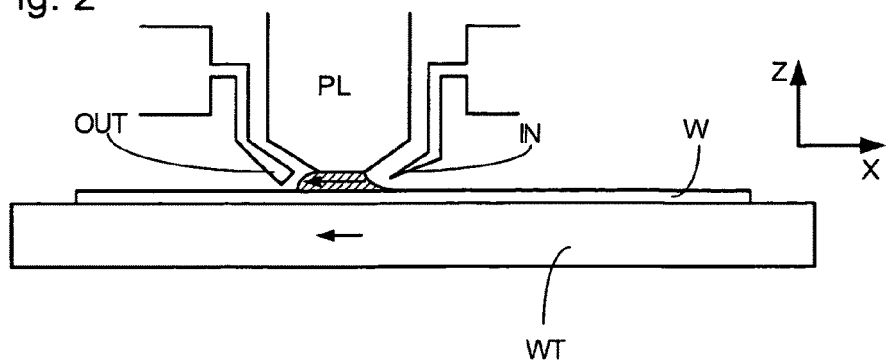
FIGS. 2 and 3 depict a liquid supply system for use in a lithographic projection apparatus.
Figure 3:
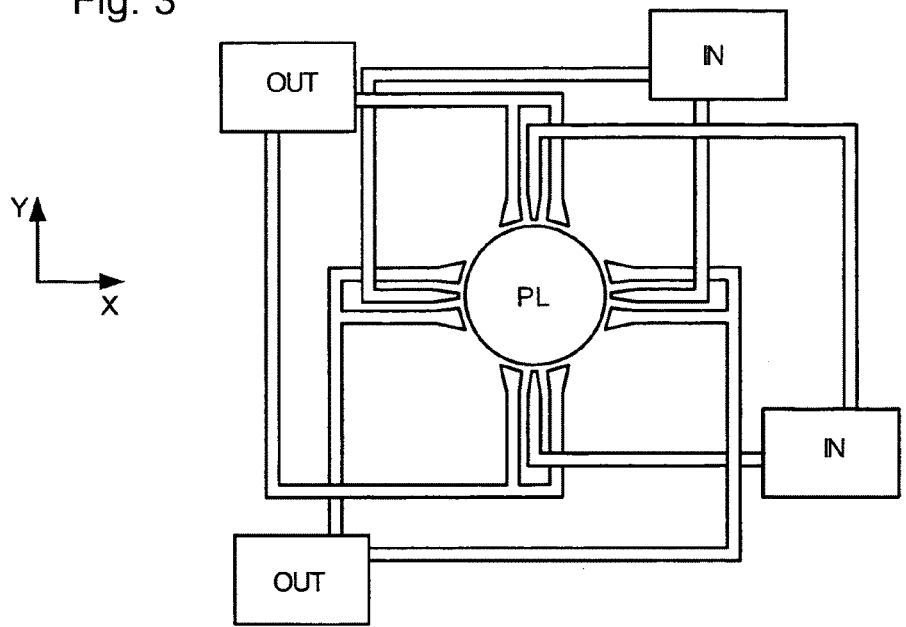
Figure 4:
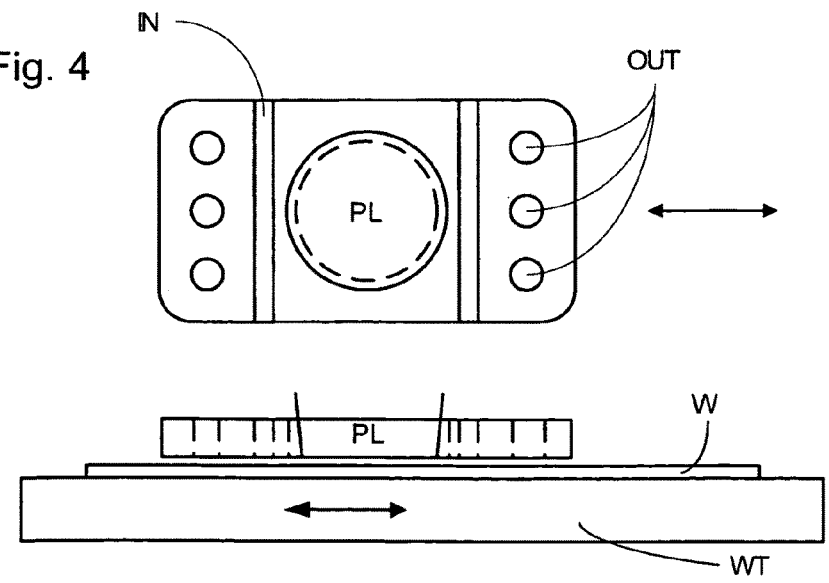
FIG. 4 depicts another liquid supply system for use in a lithographic projection apparatus.
Figure 5:
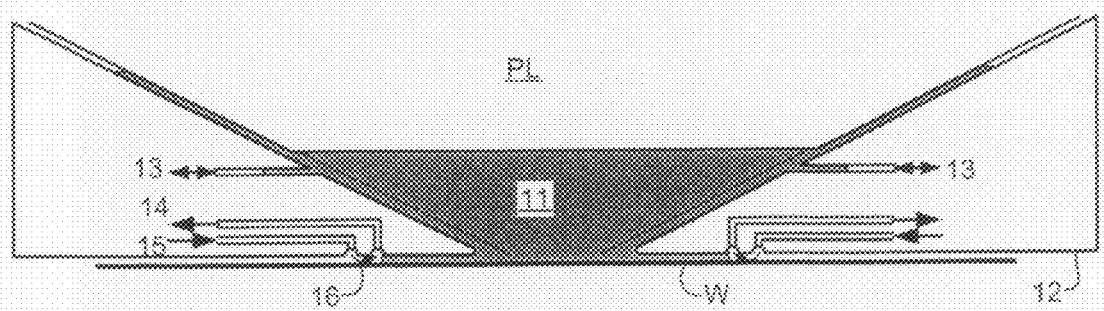
FIG. 5 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described above, FIG. 6 shows a close up of the space between a substrate W and a cover ring CR. Immersion liquid 11 enters the gap between the cover ring and the substrate and is sucked out of one or more outlets 24 in the substrate holder WH. The immersion liquid 11 penetrates a certain distance under the substrate before being sucked down via extractor 20, along with gas, which may have been supplied underneath the substrate. This causes a two-phase flow under the edge of the substrate, which may cause one or more of the problems discussed above.

Figure 6:
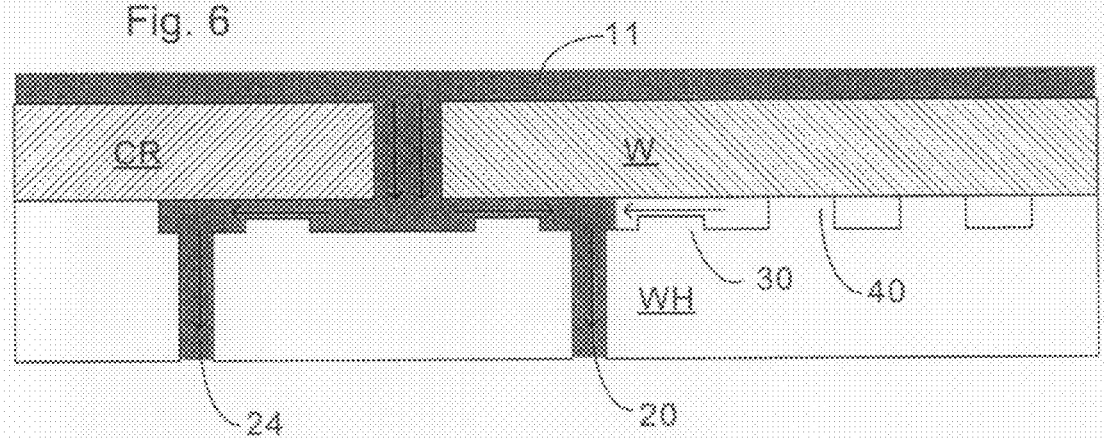
FIG. 6 depicts a system configured to help prevent liquid from reaching underneath a substrate.
Figure 7:
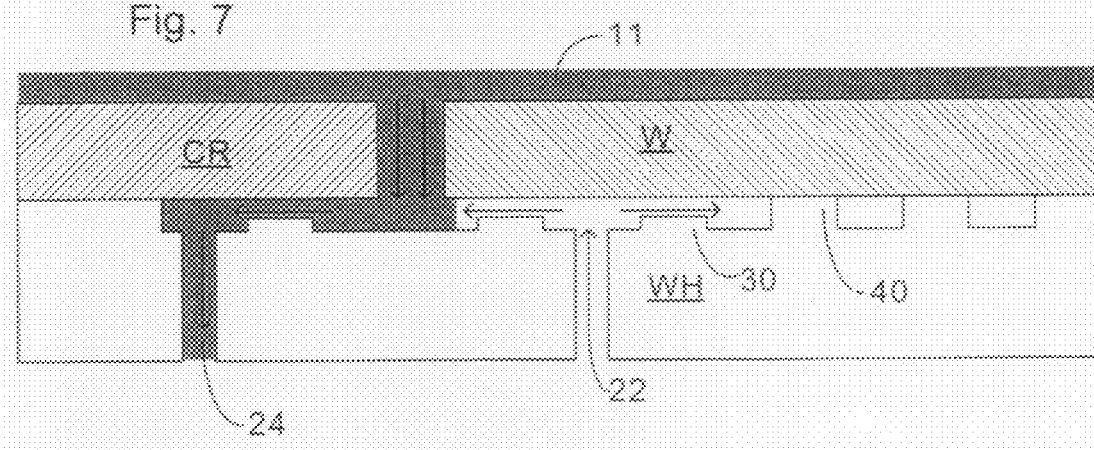
FIG. 7 depicts a system configured to help prevent liquid from reaching underneath a substrate (or other object) according to an embodiment of invention.

Substrate holder WH comprises burls 40 which hold the substrate W at a distance away from the surface of the body of the substrate holder WH. The substrate holder WH may be substantially circular and may therefore comprise a circumferential ring 30 that has a slightly lower height than the burls 40, providing a partial seal. As shown in FIGS. 6 and 7, one or more further burls may exist at or beyond the edge of the substrate on the substrate holder WH. These may be a few microns higher than the ring 30 (but lower in height than burls 40) and may aid in allowing curl-down of the substrate edge to combat potential curl-up caused by proximal two-phase flow.

FIG. 7 shows an embodiment of the present invention, whereby, rather than an extractor for a mixture of liquid (e.g., water) and gas (e.g., air), there is in fact a gas inlet 22 through which gas is supplied to cause a gas buffer at the edge of the substrate W. Immersion liquid 11 can therefore be prevented from penetrating under substrate W as long as the pressure of the gas through the inlet 22 is greater than the capillary pressure of the immersion liquid 11. The immersion liquid 11 will then be extracted purely by the extractor 24 under the cover ring CR.

The pressure of the gas input should be carefully regulated. If the pressure is too high, there is a risk of blowing bubbles through the liquid, rather than creating the buffer holding it back. If the pressure is too low, the liquid may not be held back significantly. A key is to control the gas pressure such that the bubble point of the capillary gap between the substrate and the substrate holder is not exceeded.

In order to determine the pressure of the input gas through inlet 22, the overpressure must be greater than the capillary pressure of the immersion liquid (but less than the bubble-forming pressure) which may be determined as follows:

$$\Delta P = \Delta F / \text{area of space under a substrate}$$

$$= \frac{f(2\pi r)}{\pi r^2}$$

Figure 8A:
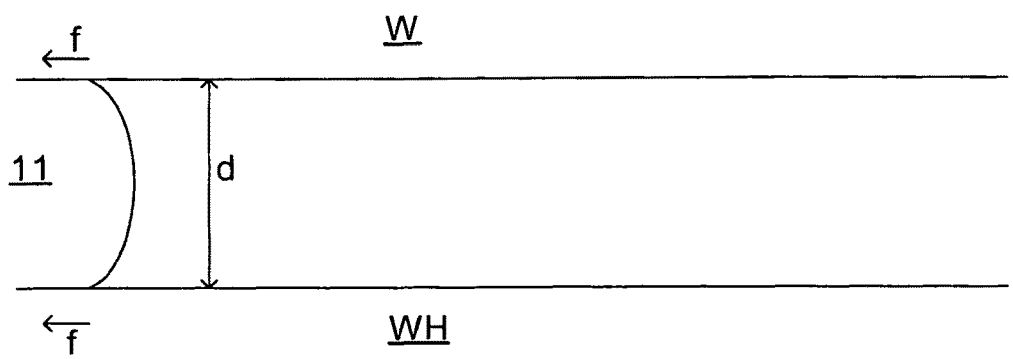
FIG. 8 depicts a close up view of the meniscus of liquid at the edge of a substrate.
Figure 8B:
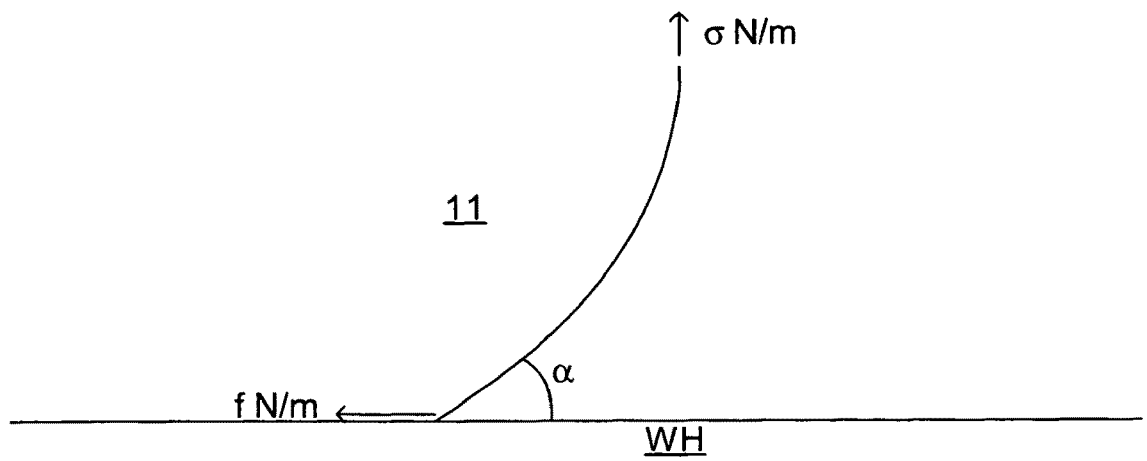

Knowing that $$r = \frac{d}{2}$$

according to FIG. 8, $$\Delta P = \frac{f(\pi d)}{\pi \left(\frac{d}{2}\right)^2}$$

$$= \frac{4f}{d}$$

According to FIG. 8, $$f = \sigma \cdot \cos \alpha$$

Therefore, $$\Delta P = \frac{4\sigma \cos \alpha}{d}$$

The hydrophilic contact angle will be less than 50° and so, for example, with a gap of 20 μm and a contact angle of 30°, the capillary pressure will be approximately 6500 Pa. Thus, a 7000 Pa overpressure is sufficient to overcome this capillary pressure and keep the bottom surface of the substrate substantially dry, without blowing so hard that bubbles are produced in the liquid.

The heights of the ring 30 and the burls 40 may be adjusted such that a curl-down of the edges of the substrate W may be allowed. This may help to compensate for any curl-up caused by the cooling action of a two-phase flow of the immersion liquid 11 and the gas through inlet 22. One way of doing this is by having the burls 40 about 3 or 4 μm higher in height than the ring 30. The edge of the substrate W is thereby less supported and atmospheric or immersion liquid pressure will have a greater effect on the unsupported edge of the substrate.

A ring 30 may be located radially inward from the gas inlet 22 and radially outward of the burls 40. Additionally or alternatively, one or more rings, like ring 30, may be located radially outward from the gas inlet 22 and radially inward from the extractor 24.

The supplied gas should not only have its pressure carefully controlled, but also its temperature. The temperature of the overpressurized gas should be as close to the temperature of the substrate and the substrate holder as possible.

The entire apparatus and method hereinbefore described is also suitable for preventing liquid from penetrating under other objects. For example, it may suitable for preventing liquid from penetrating under a closing plate when, for example, substrates are being swapped between exposures. In the figures, the closing plate would take the place of the substrate and the space between either the substrate table and the closing plate is provided with a gas input in the same way. The substrate table is also affected by cooling-related distortions, which in turn may cause overlay errors on a substrates placed on the substrate table. These distortions may also cause an error in focusing and imaging. The substrate table should therefore also be kept at a substantially constant temperature.

Furthermore, a closing plate should not stick to a substrate table, e.g. by capillary action of the liquid seeping under the plate. This may affect the reliability of the closing plate and could cause a local curl-up of the edge of the plate, which could affect the build-up of a clamping pressure that attaches the closing plate properly to the substrate table or to a liquid supply system structure. The apparatus is therefore useful for keeping a gas space between the closing plate and the substrate table. Also, when moving the substrate table relative to the liquid supply system, this apparatus and method is useful for preventing spillage of the liquid during the moving.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate-used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term "ring" herein should be understood as including other shapes than circular.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
    a projection system configured to project a patterned radiation beam onto a target portion of a substrate;
    an object holder configured to hold an object;
    a liquid supply system configured to supply liquid to a top surface of the object;
    a gas inlet located near a bottom edge of the object when held by the object holder, the gas inlet configured to supply gas to a space between the object and the object holder to repel liquid that enters a gap between the object and the object holder; and
    a temperature control device configured to control a temperature of supplied gas.

2. The apparatus according to claim 1, wherein the object comprises a substrate, or a cover plate, or both a substrate and a cover plate.

3. The apparatus according to claim 1, further comprising an outlet configured to provide a low pressure between the object and the object holder.

4. The apparatus according to claim 1, configured to regulate the temperature of the supplied gas to be close to the temperature of the object, or of the object holder, or of both the object and the object holder.

5. The apparatus according to claim 1, further comprising an extractor configured to extract liquid repelled by the supplied gas.

6. The apparatus according to claim 5, wherein the extractor is outside of an area covered by the object when the object is held by the object holder.

7. The apparatus according to claim 1, wherein an input pressure of the gas, when supplied, is greater than or equal to a capillary pressure of the liquid when between the object and the object holder.

8. The apparatus according to claim 7, wherein the input pressure is an overpressure of about 7000 Pa and a distance between the object and the object holder is about 20 μm.

9. The apparatus according to claim 1, configured control the pressure of the gas such that a bubble point of the space between the object and the object holder is not exceeded.

10. A lithographic apparatus, comprising:
a projection system configured to project a patterned radiation beam onto a target portion of a substrate;
an object holder configured to hold an object;
a liquid supply system configured to supply liquid to a top surface of the object; and
a gas inlet located near a bottom edge of the object when held by the object holder, the gas inlet configured to supply gas to a space between the object and the object holder so as to substantially prevent liquid entering a gap between the object holder and the object from substantially coming into contact with a bottom surface of the object.

11. The apparatus according to claim 10, wherein the object comprises a substrate, or a cover plate, or both a substrate and a cover plate.

12. The apparatus according to claim 10, further comprising an outlet configured to provide, a low pressure between the object and the object holder.

13. The apparatus according to claim 10, further comprising an extractor configured to extract liquid prevented from substantially coming into contact with a bottom surface of the object.

14. The apparatus according to claim 10, wherein the object holder comprises a peripheral ring and burls, the ring configured to facilitate a seal under the object when held by the object holder and the burls configured to support the object.

15. The apparatus according to claim 14, wherein the burls are higher than the ring, causing a gap to exist between the ring and the object when held by the object holder and allowing curl-down of the edge of the object.

16. The apparatus according to claim 15, wherein the gap between the ring and the object is 3 to 4 μm.

17. The apparatus according to claim 15, wherein the gas inlet is located inside of the ring but outside the burls.

18. The apparatus according to claim 15, further comprising a second peripheral ring concentrically inside the first peripheral ring and the gas inlet is between the first and second rings.

19. The apparatus according to claim 15, configured control the pressure of the gas such that a bubble point of the space between the object and the object holder is not exceeded.

20. The apparatus according to claim 15, wherein a surface of the object holder, or the bottom surface of the object, or both the surface of the object holder and the bottom surface of the object, is hydrophilic.

21. The apparatus according to claim 20, wherein hydrophilic comprises a contact angle of less than 50°.

22. A method of sealing an object from liquid supplied to at least a top surface of the object comprising inputting gas at a lower edge of the object to provide a gas buffer at the edge so as to substantially prevent liquid entering a gap between the object and a structure adjacent the object from substantially coming into contact with a bottom surface of the object.

23. The method according to claim 22, wherein the object comprises a substrate, or a cover plate, or both a substrate and a cover plate.

24. The method according to claim 22, further comprising extracting liquid repelled by the gas buffer.

25. The method according to claim 22, wherein an input pressure of the gas is greater than or equal to a capillary pressure of the liquid between the object and the structure.

26. The method according to claim 22, further comprising controlling the pressure of the gas such that a bubble point of a gap between the object and the structure is not exceeded.

27. The method according to claim 22, wherein a surface of the structure, or the bottom surface of the object, or both the surface of the structure and the bottom surface of the object, is hydrophilic.

28. The method according to claim 27, wherein hydrophilic comprises a contact angle of less than 50°.

29. A device manufacturing method, comprising:
projecting, via a liquid, a patterned beam of radiation onto a target portion of a substrate;
supplying gas at a lower edge of an object, when held by an object holder, to a space between the object and the object holder to repel liquid that enters a gap between the object and the object holder; and
controlling a temperature of supplied gas.

30. The method according to claim 29, wherein the object comprises a substrate, or a cover plate, or both a substrate and a cover plate.

31. The method according to claim 29, further comprising providing a low pressure between the object and the object holder.

32. The method according to claim 29, comprising regulating the temperature of the supplied gas to be close to the temperature of the object, or of the object holder, or of both the object and the object holder.

33. The method according to claim 29, further comprising extracting liquid outside of the lower edge of the object to remove liquid repelled by the gas.

34. The method according to claim 29, wherein an input pressure of the gas is greater than or equal to a capillary pressure of the liquid between the object and the object holder.

35. The method according to claim 29, further comprising controlling the pressure of the supplied gas such that a bubble point of a gap between the object and the object holder is not exceeded.

36. A lithographic apparatus, comprising:
a projection system configured to project a patterned radiation beam onto a target portion of a substrate;
an object holder configured to hold an object;
a liquid supply system configured to supply liquid to a top surface of the object;
a gas inlet located near a bottom edge of the object when held by the object holder, the gas inlet configured to supply gas to a space between the object and the object holder to repel liquid that enters a gap between the object and the object holder; and an outlet located near a bottom edge of the object when held by the object holder and located radially outward of the gas inlet, the outlet configured to remove substantially only liquid that enters the gap between the object and the object holder.

* * * * *